(12) United States Patent
Kwak et al.

(10) Patent No.: US 11,611,113 B2
(45) Date of Patent: Mar. 21, 2023

(54) SIMULTANEOUS INSPECTION DEVICE OF MULTIPLE SECONDARY BATTERY CELL POUCHES

(71) Applicant: LG CHEM, LTD., Seoul (KR)

(72) Inventors: Gi Young Kwak, Suwon-Si (KR); Sung Tae Kim, Daejeon (KR); Nak Gi Sung, Daejeon (KR); Joon Sup Kang, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 302 days.

(21) Appl. No.: 16/759,064

(22) PCT Filed: Jun. 10, 2019

(86) PCT No.: PCT/KR2019/006934
§ 371 (c)(1),
(2) Date: Apr. 24, 2020

(87) PCT Pub. No.: WO2019/240443
PCT Pub. Date: Dec. 19, 2019

(65) Prior Publication Data
US 2021/0184272 A1    Jun. 17, 2021

(30) Foreign Application Priority Data

Jun. 11, 2018 (KR) .......................... 10-2018-0066651
Nov. 21, 2018 (KR) .......................... 10-2018-0144260

(51) Int. Cl.
*H01M 10/42*   (2006.01)
*G01R 31/396*  (2019.01)
*G01R 31/392*  (2019.01)

(52) U.S. Cl.
CPC ...... *H01M 10/4285* (2013.01); *G01R 31/392* (2019.01); *G01R 31/396* (2019.01); *H01M 10/4228* (2013.01)

(58) Field of Classification Search
CPC ......... H01M 10/4285; H01M 10/4228; H01M 10/482; G01R 31/392; G01R 31/396;
(Continued)

(56) References Cited

U.S. PATENT DOCUMENTS

2001/0019270 A1    9/2001  Onishi et al.
2003/0222929 A1*   12/2003  Horigome ................ B41J 29/38
                                                     347/5
(Continued)

FOREIGN PATENT DOCUMENTS

AR    10-2017-0095013 A    8/2017
CN    102422479 A          4/2012
(Continued)

OTHER PUBLICATIONS

International Search Report (PCT/ISA/210) dated PCT/KR2019/006934, dated Sep. 20, 2019.
(Continued)

*Primary Examiner* — Lee E Rodak
*Assistant Examiner* — Trung Q Nguyen
(74) *Attorney, Agent, or Firm* — Birch, Stewart, Kolasch & Birch, LLP (57) ABSTRACT

A simultaneous inspection device of multiple secondary battery cell pouches is provided. The simultaneous inspection device includes a support member installed for support; a movable member installed to face the support member; multiple pressure panels which are installed side by side between the support member and the movable member, and combined so that the gap between them can be adjusted by the back and forth movement of the movable member
(Continued)

wherein the secondary battery cell pouches are inserted into each gap; a guide member for guiding the pressing panels to move in the direction necessary for adjusting the gaps; and a pressure driving unit for moving the movable member back and forth to pressurize and pressure-release the secondary battery cell pouch between the pressurizing panels on both sides.

17 Claims, 11 Drawing Sheets

(58) Field of Classification Search
CPC .............. G01R 31/382; G01R 31/367; G01R 31/3648; Y02E 60/10
USPC ..... 324/400–437, 500, 756.05–758.1, 754.1, 324/754.07, 754.24, 755.01, 754.03, 324/754.14, 756.03, 724, 445–446
See application file for complete search history.

(56) References Cited

U.S. PATENT DOCUMENTS

| | | | |
|---|---|---|---|
| 2011/0062915 A1 | 3/2011 | Shin et al. | |
| 2012/0321934 A1* | 12/2012 | Hopkins | H01M 50/204 429/151 |
| 2013/0330584 A1 | 12/2013 | Lee et al. | |

FOREIGN PATENT DOCUMENTS

| | | |
|---|---|---|
| CN | 102770986 A | 11/2012 |
| CN | 103492892 A | 1/2014 |
| JP | 2001-236985 A | 8/2001 |
| JP | 2002-134176 A | 5/2002 |
| JP | 2010-231948 A | 10/2010 |
| JP | 2014-93270 A | 5/2014 |
| JP | 2017-40633 A | 2/2017 |
| JP | 2018-22564 A | 2/2018 |
| JP | 2018-22565 A | 2/2018 |
| KR | 10-2009-0060186 A | 6/2009 |
| KR | 10-2014-0000398 A | 1/2014 |
| KR | 10-2014-0138383 A | 12/2014 |
| KR | 10-2015-0014544 A | 2/2015 |
| KR | 10-2015-0045621 A | 4/2015 |
| KR | 10-1521267 B1 | 5/2015 |
| KR | 101521267 * 5/2015 ............. Y02E 60/10 | |
| KR | 10-2016-0008879 A | 1/2016 |
| KR | 10-2016-0068244 A | 6/2016 |
| KR | 10-2017-0062402 A | 6/2017 |
| KR | 10-2017-0068145 A | 6/2017 |
| KR | 10-2017-0106501 A | 9/2017 |
| KR | 10-2018-0000120 A | 1/2018 |
| KR | 10-1896218 B1 | 9/2018 |

OTHER PUBLICATIONS

Chinese Office Action and Search Report for Chinese Application No. 201980005179.0, dated Sep. 24, 2021, with an English translation.

Extended European Search Report for European Application No. 19818937.5, dated Jan. 12, 2021.

Korean Office Action for Korean Application No. 10-2018-0144260, dated Jan. 21, 2021, with an English translation.

* cited by examiner

SIMULTANEOUS INSPECTION DEVICE OF MULTIPLE SECONDARY BATTERY CELL POUCHES

TECHNICAL FIELD

This application claims the benefit of priority based on Korean Patent Application No. 10-2018-0066651 filed on Jun. 11, 2018 and Korean Patent Application No. 10-2018-0144260 filed on Nov. 21, 2018, and the content of these Korean Patent Applications are incorporated herein as part of the present specification.

The present invention relates to a device for simultaneously inspecting a plurality of secondary battery cell pouches, and more particularly, to a device for simultaneously inspecting a plurality of secondary battery cell pouches capable of increasing the reliability of the quality of the secondary cell pouches by allowing easy and quick inspection of defects caused by internal membrane breakage or foreign matter of the plurality of secondary battery cell pouches.

BACKGROUND ART

In general, secondary batteries are rechargeable and have a large capacity, and some examples thereof include nickel cadmium, nickel hydrogen, and lithium secondary batteries. Among them, lithium secondary batteries are in the spotlight for their advantages such as free charge and discharge, very low self-discharge rate, and high energy density compared to nickel-based secondary batteries. In general, such a secondary battery may be classified into a cylindrical or square can-type secondary battery and a pouch-type secondary battery according to an exterior material or an application form.

Since the pouch-type secondary battery is formed by using a pouch exterior material composed of a multilayer film including a metal layer (foil) and a synthetic resin layer coated on the upper and lower surfaces of the metal layer, the weight of the battery can be remarkably reduced compared to the cylindrical or square shape using metal cans, which makes it possible for the battery to be lightened and changed into various forms. Its usage is also gradually increasing.

The secondary battery is manufactured by accommodating an electrode assembly of a positive electrode/separator/negative electrode in a battery container such as a pouch, injecting an electrolyte solution, and then sealing the battery container. Herein, defects may occur due to various causes during the assembly process of the electrode assembly or the assembly process of the secondary battery or during use thereof. Among these, a phenomenon in which a manufacture-completed battery shows a voltage drop behavior higher than a self-discharge rate is referred to as low voltage defect. The low voltage defect is often caused by a metal foreign matter present in the secondary battery. The metal foreign matter may cause an internal short circuit of the secondary battery, and as a result, it may cause the failure, damage and ignition of the secondary battery.

Hence, secondary batteries should be operated to check for defects, including insulation, so that defects can be eliminated at the source, and the related prior art includes "Insulation testing method and system of pouch battery cell" of Korean Patent Publication No. 10-2010-0044407. Herein, the method includes a loading step of loading the pouch battery cell on the lower support for supporting the bottom of the pouch battery cell; a contact step of contacting a probe with a pouch side part of the stacked pouch battery cell and an electrode of the pouch battery cell; and a measuring step of measuring the electrical characteristic value between the contacted probes.

However, such a conventional technology is carried out using a separate lower and upper support, but in the end, the probe means of the measuring device is brought into contact with the electrode of the pouch battery cell and the like to check the insulation through resistance measurement. Likewise, when performing the inspection by hand, there is a limit in increasing the accuracy and reliability of the inspection.

In addition, the prior art has a problem that the efficiency of the inspection is significantly low as the inspection is performed by hand and even individual inspection is performed for each pouch battery cell.

In particular, the pouch-type secondary battery may cause damage to an internal separator in a manufacturing process, and may cause an internal short circuit of the secondary battery due to damage of the separator. Therefore, in order to improve the quality and reliability of such a secondary battery, it is necessary to check the damage of the separator. However, in the case of the pouch-type battery cell, it is not easy to present a device that can accurately determine the damage of the separator separately by connecting to the electrode of each of the plurality of pouch battery cells due to the plate-shaped structure characteristics. Therefore, it is necessary to develop an inspection device to solve this problem.

DISCLOSURE

Technical Problem

An object of the present invention is to easily and quickly inspect whether a plurality of secondary battery cell pouches are damaged inside the separator to thereby increase the reliability of the secondary battery cell pouch and increase the efficiency and accuracy of the inspection of a plurality of secondary battery cell pouches, and another object of the present invention is to minimize the installation space limitation by constructing an inspection device in a compact size compared to the number of simultaneous inspections of the secondary battery cell pouches.

Technical Solution

In order to solve the above-mentioned problems, according to an aspect of the present invention, there is provided a device for simultaneously inspecting a plurality of secondary battery cell pouches, including a support member, a movable member installed to face the support member, a plurality of pressing panels installed in parallel between the support member and the movable member, adjacent pressing panel are coupled to allow adjustment of a gap between adjacent pressing panels by movements of the movable member towards and away from the support member, a guide member configured to guide each pressing panel to allow adjustment of the gap between the adjacent pressing panels, and a pressing driver configured to move the movable member towards and away from the support member so as to be capable of pressing and releasing a secondary battery cell pouch located between the adjacent pressing panels.

Herein, the device may further include a current inspector configured to apply a voltage to the secondary battery cell pouch and measure its current.

Herein, the device may further include an electrode module configured to be connectable to one electrode terminal of the secondary battery cell pouch disposed in the gap between the adjacent pressing panels to thereby apply of receive current.

Each pressing panels may include connection links extending across the gap at opposite sides of the pressing panel, each connection link having a guide hole, and connection pins located at the opposite sides of the pressing panel, the connection pins may be inserted into the guide holes formed in the connection links of the adjacent pressure panels to thereby be coupled to each other so that the gap is adjustable by the connection links and the connection pins which are arranged alternately up and down.

The electrode module may be installed in plurality between the pressure panels, and are fixed to each pressing panel to thereby move together with the pressing panel.

Each electrode module may include a fixed member fixed to one side of the pressing panel, an electrode actuator fixed to the fixed member and having movable tips disposed to be moveable to allow a gap adjustment between the moveable tips, a fixed piece fixed to each of the movable tips, and an electrode connection unit configured to be in surface contact with opposite side surfaces of the electrode terminal of the secondary battery cell pouch when driven by the electrode actuator, the electrode connection unit being installed on each of the fixed pieces to face each other.

Each electrode module may be installed in a mounting groove formed in the pressing panel, a guide hole extending in a width direction of the secondary battery cell pouch may formed in the fixed member, and the fixed position may be varied in the width direction by a fixing bolt inserted into a desired position in the guide hole and screwed into the mounting groove.

The current inspector may include a power source for applying a voltage to reach a cell range in a predetermined range with respect to the cell pouch pressurized by the pressing panel; and a current measuring unit for measuring a current value flowing through the cell pouch.

The pressing driver may include a drive motor configured to supply a driving force; a drive timing pulley configured to be rotated by the drive motor, guide pulleys configured to be respectively installed on opposite sides of the drive timing pulley, driven timing pulleys configured to be respectively installed side by side on opposite sides of the drive timing pulley, a timing belt configured to be connected to the driven timing pulleys from the drive timing pulley so as to be guided to the guide pulleys and thereby transmit a rotational force, and a lead screw configured to be fixed to each of the driven timing pulleys so as to be rotated together, screwed through opposite sides of the movable member, and inserted into a through hole of each pressing panel The device may further include a guide configured to be installed on an upper part of each pressing panel to guide an entry and exit of the secondary battery cell pouch with respect to the gap.

The guide may include a support shaft extending vertically upward from an upper end of the pressing panel, a guide tip, and a hinge guide having an upper portion hinged to opposite sides of the guide tip, the hinge guide having a "◁" shape to be disposed toward a gap sides so that a central portion protrudes toward the gap side.

The device may further include an elastic supporter configured to elastically support the support member to be restored toward the pressing panels, in which the elastic supporter may include a fixed panel fixed to the the support member and a compression spring inserted into the guide member so as to be positioned between the fixed panel and the support member.

The device may further include a controller configured to be respectively connected to the pressing driver and the current inspector to thereby control each operation of the pressing driver and the current inspector, and compare a current value measured by the current inspector with a reference value to thereby determine whether there is a defect.

The controller may determine whether there is a defect by comparing an average value of current values measured by the current inspector for 2 to 10 seconds with the reference value.

The device may further include a pressing pad or a pressing piece attached to one side or opposite sides of each pressing panel.

The device may further include a support roller connected to each pressing panel by a roller coupler.

Advantageous Effects

According to a device for simultaneously inspecting a plurality of secondary battery cell pouches according to the present invention, it is possible to easily and quickly inspect whether a plurality of secondary battery cell pouches are damaged inside the separator to thereby increase the reliability of the secondary battery cell pouch and increase the efficiency and accuracy of the inspection of a plurality of secondary battery cell pouches, and it is possible to minimize the installation space limitation by constructing an inspection device in a compact size compared to the number of simultaneous inspections of the secondary battery cell pouches.

DETAILED DESCRIPTION OF THE PREFERRED EMBODIMENTS

Since the present invention may have various embodiments by various changes, specific embodiments will be described by way of example in the drawings. In addition, it is to be understood that the present invention is not limited to these specific embodiments, but includes all modifications, equivalents, and substitutes included in the technical idea of the present invention.

Hereinafter, exemplary embodiments of the present invention will be described in detail with reference to the accompanying drawings, and the same reference numerals are assigned to the same or corresponding components regardless of the reference numerals, and redundant description thereof will be omitted.

In the present invention, a cell pouch is a concept including all of a battery cell in which an electrode assembly has been inserted into a pouch-type exterior material, a battery cell in which an electrode assembly has been inserted into pouch-type exterior material and electrolyte has been injected, and a battery cell in which an electrode assembly has been inserted into pouch-type exterior material, electrolyte has been injected, and then sealing has been completed.

Figure 1:
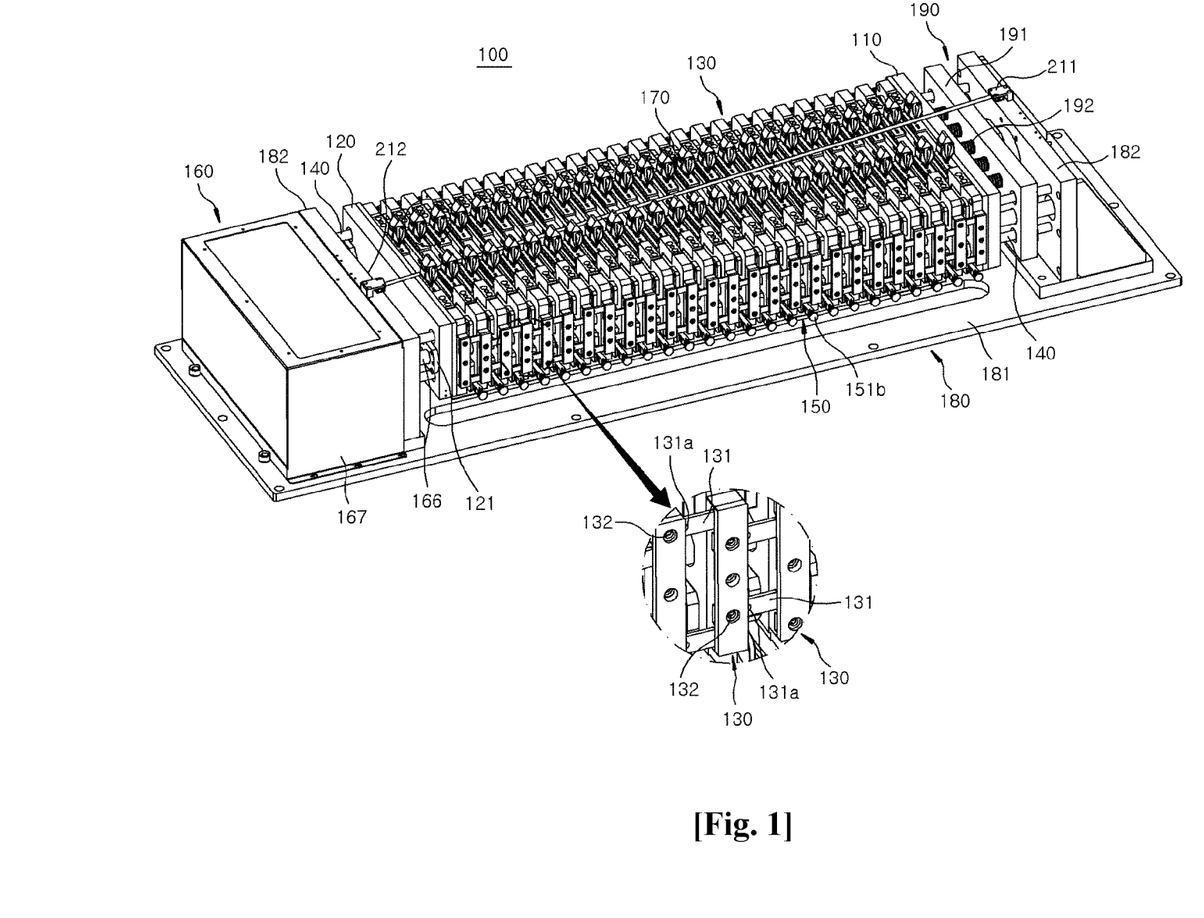
FIG. 1 is a perspective view illustrating a device for simultaneously inspecting a plurality of secondary battery cell pouches according to an exemplary embodiment of the present invention.
Figure 2:
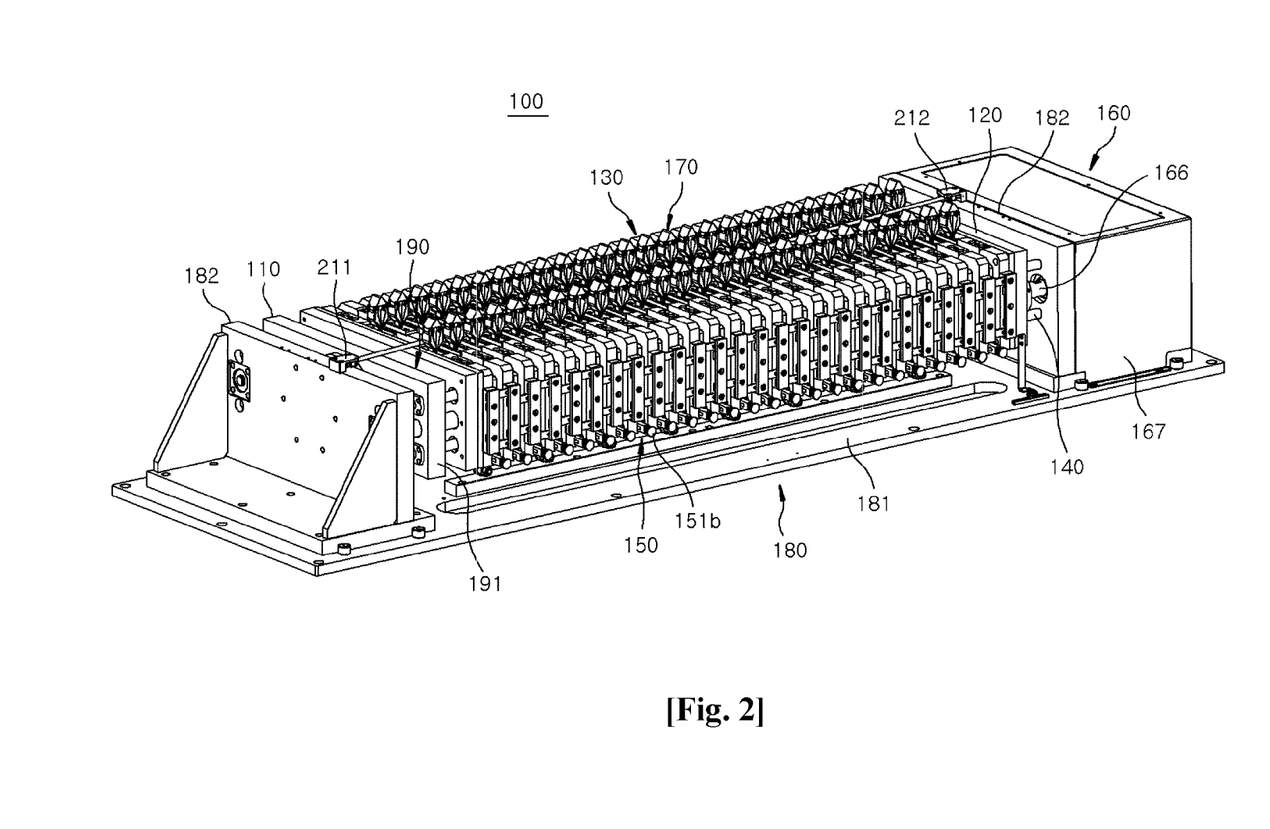
FIG. 2 is a perspective view illustrating a device for simultaneously inspecting a plurality of secondary battery cell pouches, from a different direction, according to an exemplary embodiment of the present invention.
Figure 3:
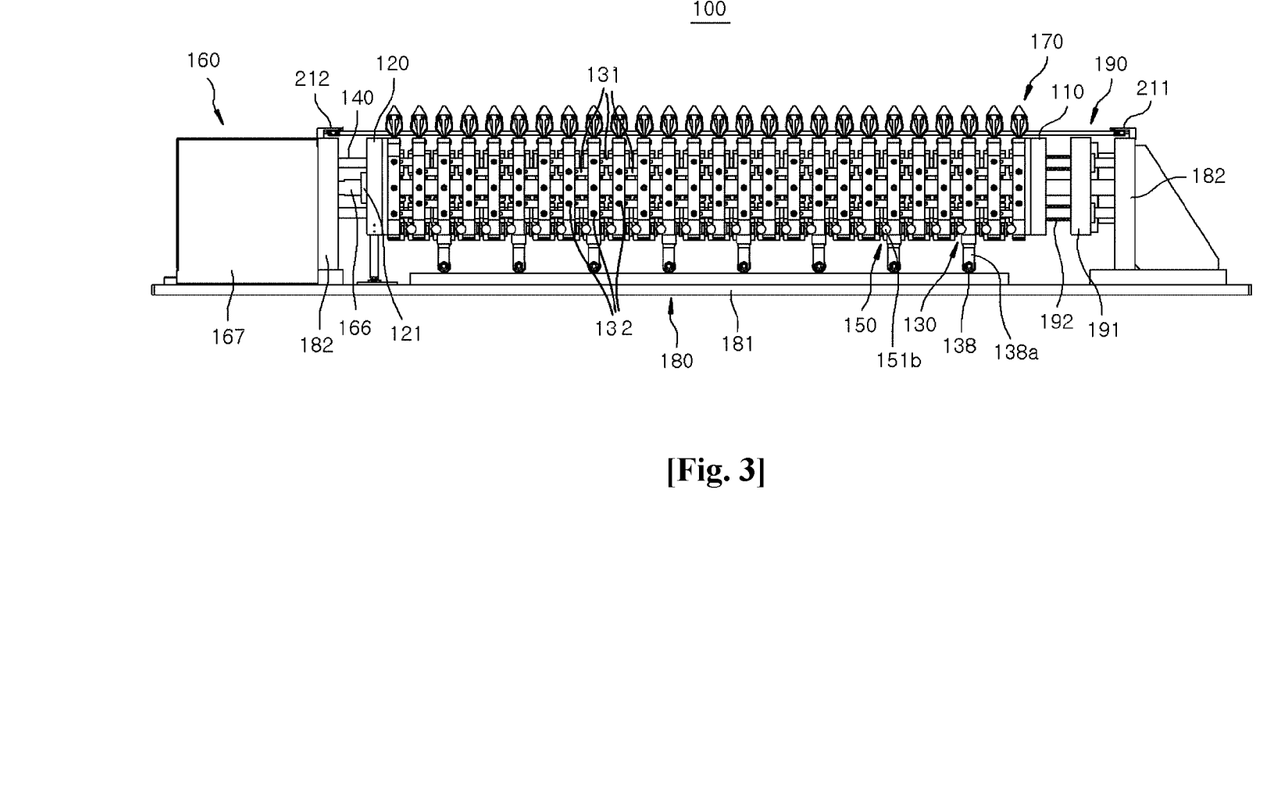
FIG. 3 is a side view illustrating a device for simultaneously inspecting a plurality of secondary battery cell pouches according to an exemplary embodiment of the present invention.

FIG. 1 is a perspective view illustrating a device for simultaneously inspecting a plurality of secondary battery cell pouches according to an exemplary embodiment of the present invention, FIG. 2 is a perspective view illustrating a device for simultaneously inspecting a plurality of secondary battery cell pouches, from a different direction, according to an exemplary embodiment of the present invention, and FIG. 3 is a side view illustrating a device for simultaneously inspecting a plurality of secondary battery cell pouches according to an exemplary embodiment of the present invention.

Referring to FIGS. 1 to 3, a device 100 for simultaneously inspecting a plurality of secondary battery cell pouches according to an exemplary embodiment of the present invention may include a support member 110, a movable member 120, a pressing panel 130, a guide member 140, and a pressing drive unit 160.

The support member 110 is installed for support, for example, may be installed to be perpendicular to the frame 180 installed on the ground. As another example, the support member 110 may be installed to be elastically supported by an elastic support unit 190 as in this embodiment. The frame 180 may include, for example, a base frame 181 lying on the ground and a pair of support frames 182 provided on both sides of the base frame 181 to face each other.

The elastic support unit 190 may elastically support the support member 110 to be restored to the pressing panel 130 side, to thereby buffer the impact applied to the secondary battery cell pouch 1 between the pressing panels 130, thereby preventing the secondary battery cell pouch 1 (shown in FIGS. 9 to 12) from being broken due to an impact at the time of the pressure. The elastic support 190 may, for example, include a fixed panel 191 fixed to face the support member 110, and a compression spring 192 inserted into the guide member 140 to be located between the fixed panel 191 and the support member 110. Here, the fixed panel 191 may be vertically fixed on the base frame 181. In this case, the support member 110 may be vertically installed to be elastically supported by the compression spring 192 in a state where the guide member 140 penetrates, to thereby face the fixed panel 191.

In addition, when the pressing panel 130 pressurizes the plurality of secondary battery cell pouches 1, a load cell (not shown) may be interposed between the fixed panel 191 and the support frame 182 to measure the pressing force. If the pressure applied to the cell pouch is too high, the electrode may be detached or the appearance of the cell pouch may be damaged. On the contrary, if the pressure is too low, the positive electrode and the negative electrode may not be physically in contact with each other so that an internal short circuit may not be triggered, thereby lowering the reliability of the fault detection. As such, by sensing the pressure applied to the cell pouch 1 through the load cell, it is possible to check whether an appropriate level of pressure is applied.

The movable member 120 is installed to face the support member 110 and moves back and forth by the pressing drive unit 160 to pressurize and depressurize the pressing panel 130.

Figure 4:
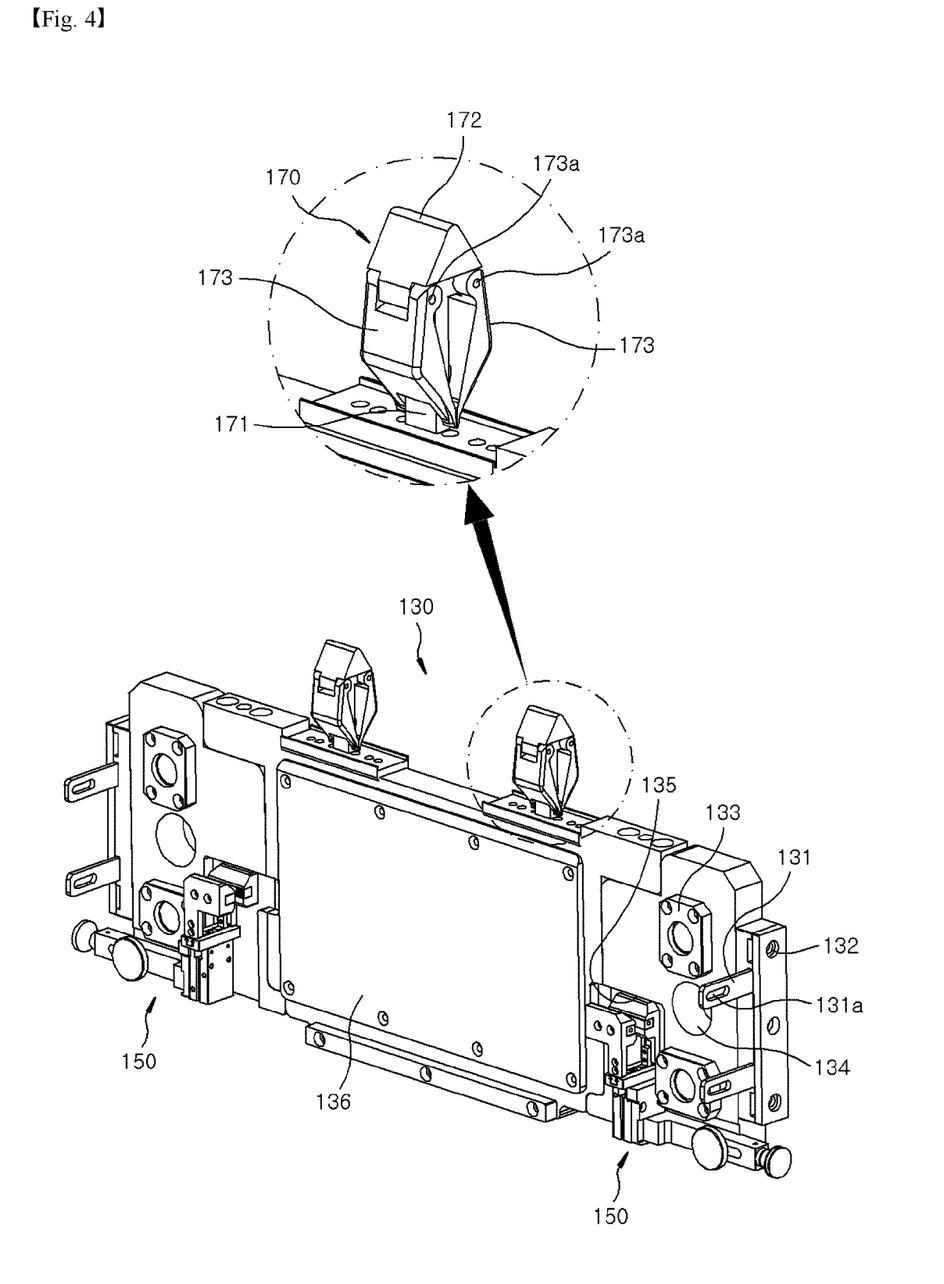
FIG. 4 is a perspective view illustrating a pressing panel in a device for simultaneously inspecting a plurality of secondary battery cell pouches according to an exemplary embodiment of the present invention.
Figure 5:
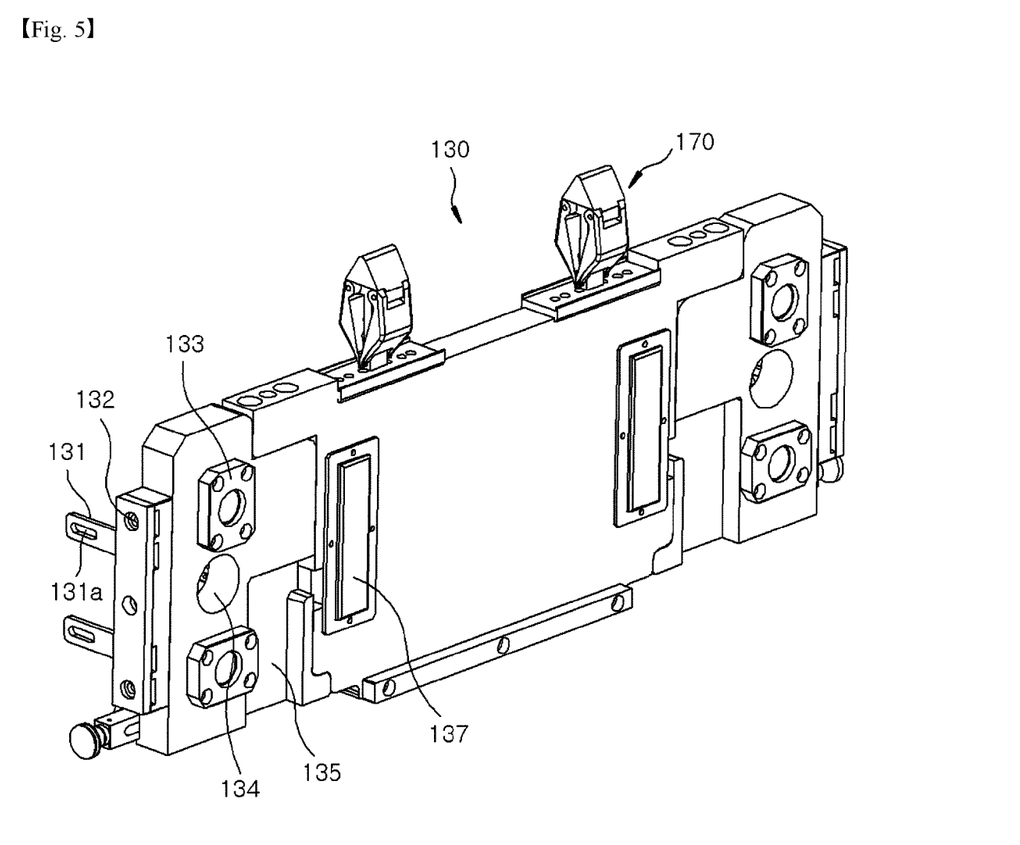
FIG. 5 is a perspective view illustrating a pressing panel in a device for simultaneously inspecting a plurality of secondary battery cell pouches, from a different direction, according to an exemplary embodiment of the present invention.
Figure 6:
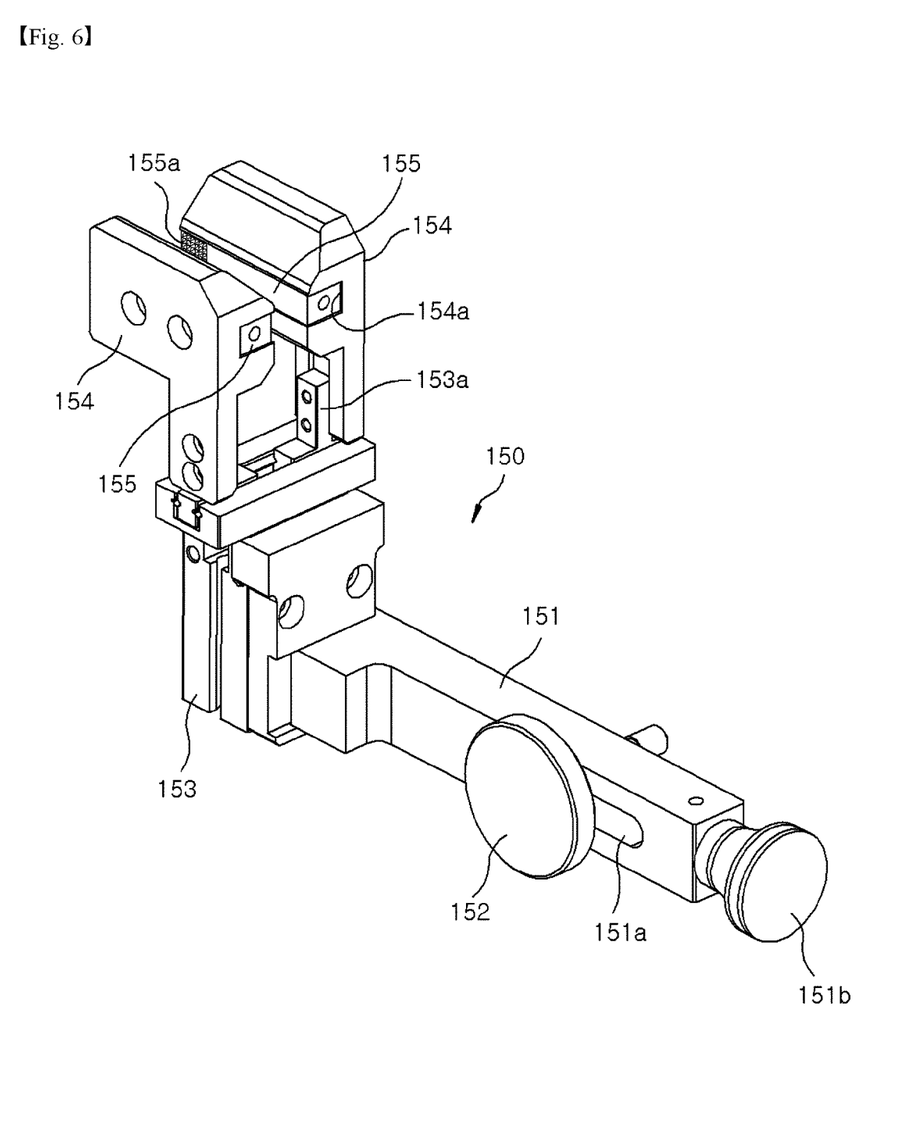
FIG. 6 is a perspective view illustrating an electrode module in a device for simultaneously inspecting a plurality of secondary battery cell pouches according to an exemplary embodiment of the present invention.
Figure 7:
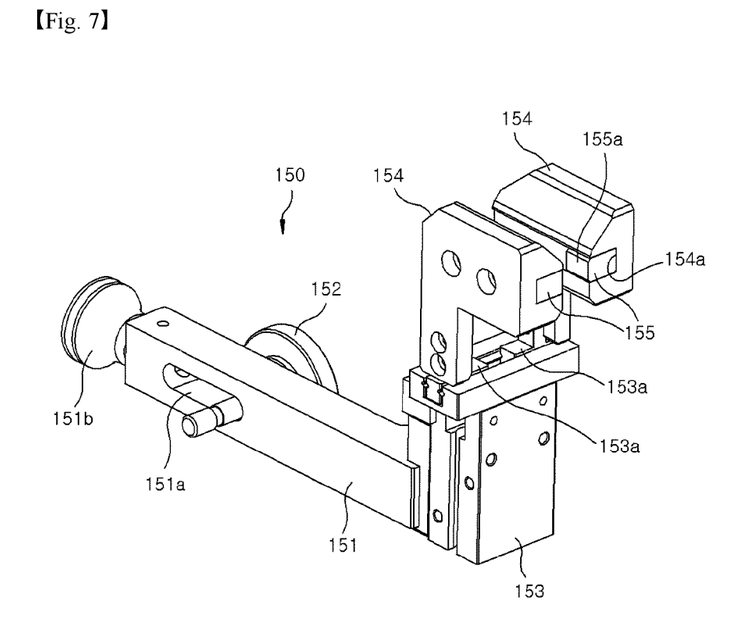
FIG. 7 is a perspective view illustrating an electrode module in a device for simultaneously inspecting a plurality of secondary battery cell pouches, from a different direction, according to an exemplary embodiment of the present invention.

Referring to FIGS. 3 to 5, a plurality of pressing panels 130 are installed vertically in parallel with each other between the support member 110 and the movable member 120, and are coupled to be spaced apart from each other by the forward and backward movement of the movable member 120, and a cell pouch 1 (shown in FIGS. 9 and 10) of the secondary battery is inserted into a gap formed therebetween. In the pressing panel 130, for example, connection links 131 having guide holes 131a extending in the direction of gap adjustment are fixed to both sides, respectively, and connection pins 132 inserted into the guide holes 131a formed in the connection links 131 of the other pressing panel 130 facing each other with a gap are provided at both sides thereof. As such, sliding coupling units 133, which are coupled to each other so that the interval is adjusted by the connecting link 131 and the connecting pin 132 which are arranged alternately up and down and are coupled so that the guide member 140 slidably penetrates, may be provided. Herein, when the plurality of pressing panels 130 are coupled by the connection link 131 and the connection pin 132, the connecting link 131 and the connecting pin 132 can be arranged alternately up and down as shown in FIG. 3. As such, when the connecting link 131 and the connecting pin 132 are arranged in a line, it is possible to avoid the interference between each other, and a plurality of connection links 131 and connection pins 132, for example, two connection links 131 and two connection pins may be provided on each side.

In order to be coupled to each other by the front and rear movement of the movable member 120 to adjust the spacing, the pressing panel 130 may be coupled to each other by the connection link 131 and the connection pin 132, and the pressing panel 130 adjacent to the movable member 120 may be attached by bolting, bonding, or fitting as described above.

In order to effectively pressurize the secondary battery cell pouch 1, a pressing pad 136 or a pressing piece 137 may be provided on one side or both sides of the pressing panel.

Referring to FIG. 4, the pressing pad 136 is attached to one surface of the pressing panel 130. The pressing pad 136 pressurizes the body part of the cell pouch 1 as a whole. Here, the cell pouch body part refers to the body portion of the cell pouch except for the electrode terminal drawn out from the cell pouch.

On the other hand, in order to effectively pressurize the portion where the defect is predicted, a stripe-shaped pressing piece 137 having a predetermined width may be attached to a predetermined portion of the pressing panel 130. Since the separator defect of the secondary battery mainly occurs at four corner portions of the cell pouch body part, the pressing pieces 137 are attached to the portion of the pressing panel 130 corresponding to the edge of the cell pouch body part.

Referring to FIG. 5, the pressing pieces 137 have a predetermined width and extend in a direction orthogonal to the direction in which the electrode terminals extend, and the pair of pressing pieces 137 is attached on the left and right ends of the pressing panel 130. Likewise, by properly selecting the attachment position of the pressing pieces 137 as described above, the pressing panel 130 can effectively press the edge portion of the body part of the cell pouch 1.

Meanwhile, unlike the embodiment of FIG. 5, a pair of pressing pieces 137 having a predetermined width may be attached to upper and lower ends of the pressing panel 130. In addition, the shape of the pressing piece is not limited to a stripe shape, but may have a shape of a square ring in which a gap is formed in the center portion.

FIGS. 4 and 5 illustrate an embodiment in which a pressing pad is attached to one surface of the pressing panel, and a pair of pressing pieces is attached to the other surface of the pressing panel. Alternatively, the pressing pad may be attached only to one surface of the pressing panel, and the pressing piece may be attached only to one surface of the pressing panel.

The shape and size of the pressing pad and the pressing piece may be appropriately selected according to the size of the secondary battery cell pouch to be inspected, and the size and the location of generation of the separator defect. In addition, the pressing pad and the pressing piece may have a thickness of 1 to 10 mm, preferably 3 to 9 mm, more preferably 5 to 8 mm. Here, the thickness may be defined as the length of the pressing pad or the pressing piece corresponding to the interval from the pressing panel to the cell pouch. When the thickness is too small, it is not preferable in effectively pressing the defective portion, and when the thickness is too large, the edges of the cell pouch may be damaged.

The material of the pressing pad and the pressing piece is not particularly limited, but the material having a too high hardness may leave a mark on the appearance of the cell pouch and may not be effective in physical contact between the positive electrode and the negative electrode. On the contrary, materials with too low hardness are easily deformed during repeated use, making the maintenance difficult and increasing the contact area with the cell pouch, which may damage the cell pouch. A rubber or elastic synthetic polymer material capable of expressing a sufficient pressurizing effect without fear of damage to the appearance of the cell pouch is preferable, and specific examples of the elastic synthetic polymer may include a polyurethane-based polymer material.

In addition, a support roller 138 may be supported on the ground by a roller coupling unit 138a at the lower side of a part of a plurality of pressing panels 130. Accordingly, the pressing panel 130 assembly may be stably moved on the base frame 181 by the support roller 138.

Each of the guide members 140 guides the pressing panel 130 to move in the direction of adjusting the interval. For this purpose, both ends of the support frame 182 of the guide member 140 may be formed of axis members fixed to each of the support frame 182 of the frame to be placed in a direction of arranging the pressing panel 130, or a plurality of guide members may be prepared side by side as in the present embodiment. The pressure panel 130 may be provided with a sliding coupling member 133 such as a bearing corresponding to each of the guide members 140 in order for the guide member 140 to be slidably coupled therethrough.

The inspection device of the present invention further includes a current inspection unit (not shown) for conducting a current inspection of the pressurized cell pouch 1. The current inspection unit applies a voltage to the plurality of cell pouches 1 through the electrode module 150 to be described later, and measures the current of the cell pouches 1. The current inspection unit may include: a power source for applying a voltage to reach a voltage range in a predetermined range with respect to the cell pouch pressurized by the pressing panel; and a current measuring unit for measuring a current value flowing through the cell pouch. The current inspection unit and the electrode module are electrically connected through a cable, an FPCB or various conductors.

The inspection device of the present invention further includes an electrode module connected to an electrode terminal of each of a plurality of secondary battery cell pouches positioned in the gap to apply or receive current.

The electrode module 150 serves to electrically connect the current inspection unit to the cell pouch 1. The electrode module may or may not be fixed to the inspection device of the present invention.

Referring to FIGS. 3 to 7, a plurality of electrode modules 150 according to an embodiment of the present invention are installed between the pressing panels 130 and fixed to the pressing panels 130 to thereby be movable with the pressing panel 130. The electrode module 150 is connected to each of the electrode terminals 1a (shown in FIGS. 10 and 12) of the secondary battery cell pouch 1 (shown in FIGS. 9 to 12) located in the gap and applies power applied from the current inspection unit to the cell pouch, or transfers the current of the cell pouch to the current inspection unit.

The electrode module 150 according to an embodiment of the present invention may include a fixed member 151 which is fixed to one side of the pressing panel 130, an electrode actuator 153 which is fixed to the fixed member 151 and has a movable tip 153a which is disposed in a gap adjusting direction to adjust the gap, each of fixed pieces 154 which are fixed to each of the movable tips 153a, and an electrode connection unit 155 in surface contact with both sides of the electrode terminal 1a (shown in FIGS. 10 to 12) of the secondary battery cell pouch 1 (shown in FIGS. 9 to 12) by the drive of the electrode actuator 153 by being installed to face each other to each of the fixed pieces 154. The electrode connection unit 155 may be provided with a contact unit 155a in which embossing is formed at the contact portion with the electrode terminal 1a so as to be accurately connected to the electrode terminal 1a of the secondary battery cell pouch 1.

The electrode module 150 may be installed in a mounting groove 135 formed in the pressing panel 130, a guide hole 151a extending in the width direction of the secondary battery cell pouch 1 may be formed in the fixed member 151, and the fixing position may be changed in the width direction of the pressing panel 130 by a fixing bolt 152 inserted into a desired position in the guide hole 151a and screwed into the mounting groove 135. In addition, the fixed member 151 may be provided with a knob 151b protruding from a gap between the pressing panels 130 in order to grip when adjusting the gap. Here, for the operation of the movable tip 153a, the electrode actuator 153 may use a pneumatic cylinder or may use a solenoid actuator. In addition, various driving means may be used.

Figure 8:
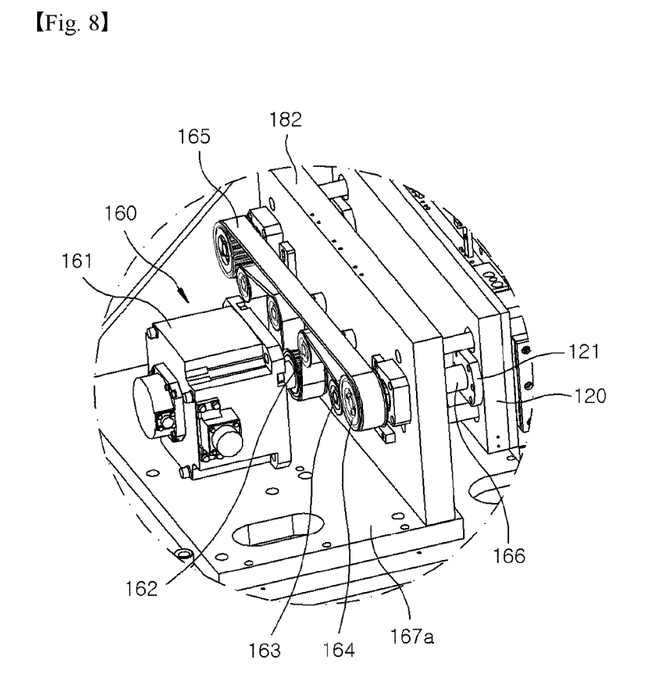
FIG. 8 is a perspective view illustrating a pressing drive unit in a device for simultaneously inspecting a plurality of secondary battery cell pouches according to an exemplary embodiment of the present invention.

Referring to FIGS. 3 and 8, the pressing drive unit 160 presses and releases the secondary battery cell pouch 1 (shown in FIGS. 9 to 12) between the pressing panels 130 from both sides by moving the movable member 120 back and forth. To this end, it may be configured in various ways, including being configured to use the reciprocating motion of the cylinder, or to convert the rotational force of the motor into a linear motion.

For example, as in this embodiment, the pressing drive unit 160 may include a drive motor 161 that provides a driving force, a drive timing pulley 162 rotated by the drive motor 161, a guide pulley 163 respectively installed side by side on both sides of the drive timing pulley 162, a driven timing pulley 164 respectively installed side by side on both sides of the drive timing pulley 162, a timing belt 165 connected to the drive timing pulley 162 and to the driven timing pulley 164 to transmit the rotational force to be guided to the guide pulley 163, and a lead screw 166 fixed to each of the driven timing pulleys 164 to be rotated together, screwed through both sides of the movable member 120, and inserted into the through hole 134 of the pressing panel 130, and the pressing drive unit 160 may be covered by a casing 167.

The drive motor 161 may be fixed by a bracket or the like on the bottom panel 167a forming the bottom of the casing 167 on the base frame 181, and may be configured as a servo motor or a stepping motor capable of controlling the amount of rotation to pressurize the secondary battery cell pouch 1 (shown in FIGS. 9 to 12) with a predetermined range of pressure.

On the other hand, since the range of the pressing force is different depending on the type or specification of the secondary battery cell pouch 1, an appropriate pressure may be selected to determine whether the separator is damaged through information on whether insulated or the amount of current between the electrode terminals 1a. The drive timing pulley 162, the guide pulley 163 and the driven timing pulley 164 may be rotatably installed on the support frame 182. On the other hand, the movable member 120 may be provided with a ball screw 121, for example, for screwing the lead screw 166.

Referring to FIGS. 3 to 5, a guide unit 170 for guiding the entrance and exit of the secondary battery cell pouch 1 (shown in FIGS. 9 to 12) with respect to a gap between the pressing panels 130 may be installed on an upper end of the pressing panel 130. The guide unit 170 may include a support shaft 171 which is installed vertically upward from the top of the pressing panel 130 for smooth and safe access of the secondary battery cell pouch 1 for the pressing panel 130, a guide tip 172 which is provided to be reduced in width toward the support shaft 171 upwards, and a hinge guide 173 having upper ends hinged to both sides of the guide tip 172 with hinge pins 173a so as to be disposed toward the gap side, and having a center portion of a "◁" shape to be protruded toward the gap side.

The inspection device of the present invention may further include a controller which is connected to the pressing drive unit, the electrode module, and the current inspection unit, respectively, to control the operation, and determines whether or not there is a defect by comparing the current value measured by the current inspection unit and the reference value. Here, the current value may mean an average value of currents measured for 2 to 10 seconds. In addition, the controller may compare the current value of the secondary battery cell pouch measured by the current inspection unit with a predetermined reference value of a good product and determine whether the value is acceptable according to the predetermined criteria, and the result of the determination may be displayed through a display unit (not shown) according to the disposed location of each secondary battery cell pouch 1.

Referring to FIGS. 1 to 3, a device 100 for simultaneously inspecting a plurality of secondary battery cell pouches may be provided with sensor units 211 and 212 for detecting entry and exit of the secondary battery cell pouch 1 (shown in FIGS. 9 to 12) installed on the upper end of the support frame 182 of the frame 180, which may be composed of a light emitting device that outputs light of a certain wavelength, and a light receiving device that receives the light of the light emitting device, and outputs a detection signal to a controller (not shown) that performs the control of the device 100 for simultaneously inspecting a plurality of secondary battery cell pouches.

In addition, the controller may control the operation of the device for simultaneously inspecting a plurality of secondary battery cell pouches according to a given process, which will be described below.

The operation of the device for simultaneously inspecting a plurality of secondary battery cell pouches according to the present invention will be described.

Figure 9:
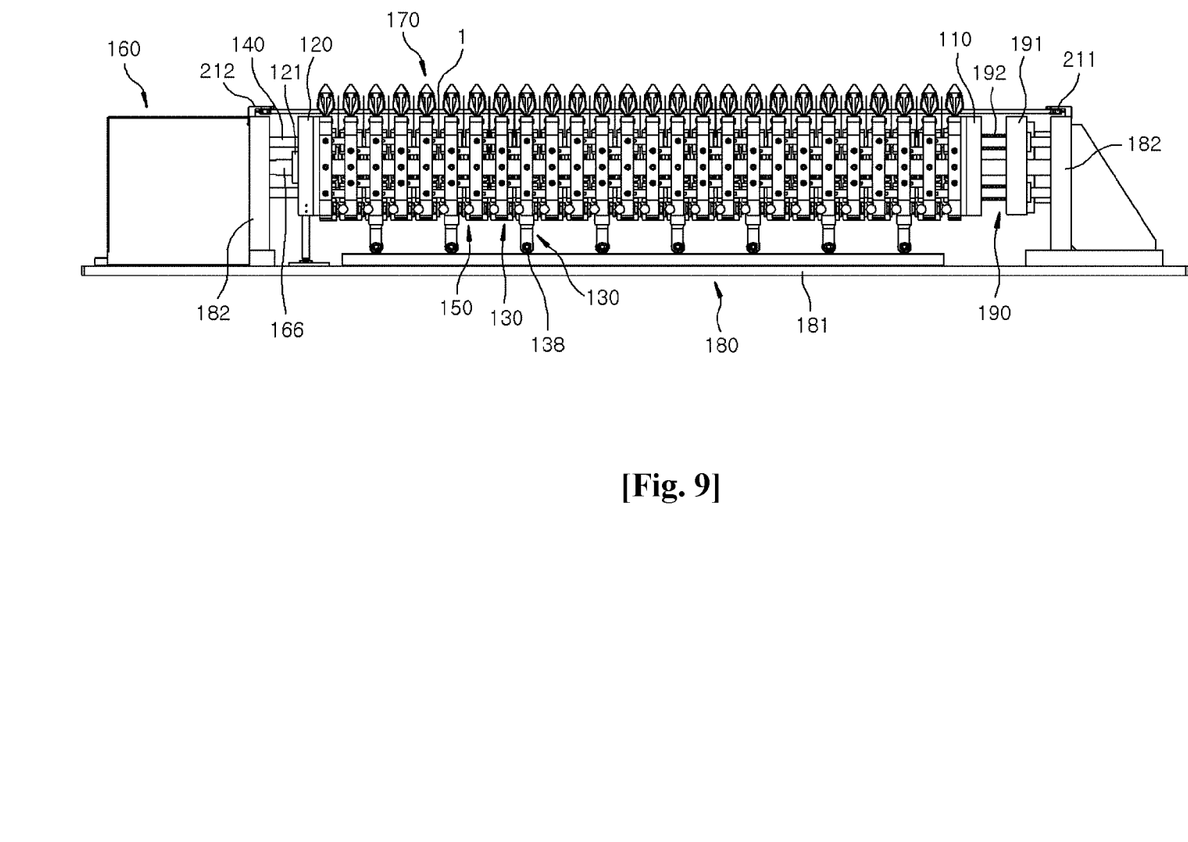
FIG. 9 is a side view illustrating a slot open state and an electrode open state of a device for simultaneously inspecting a plurality of secondary battery cell pouches according to an exemplary embodiment of the present invention.
Figure 10:
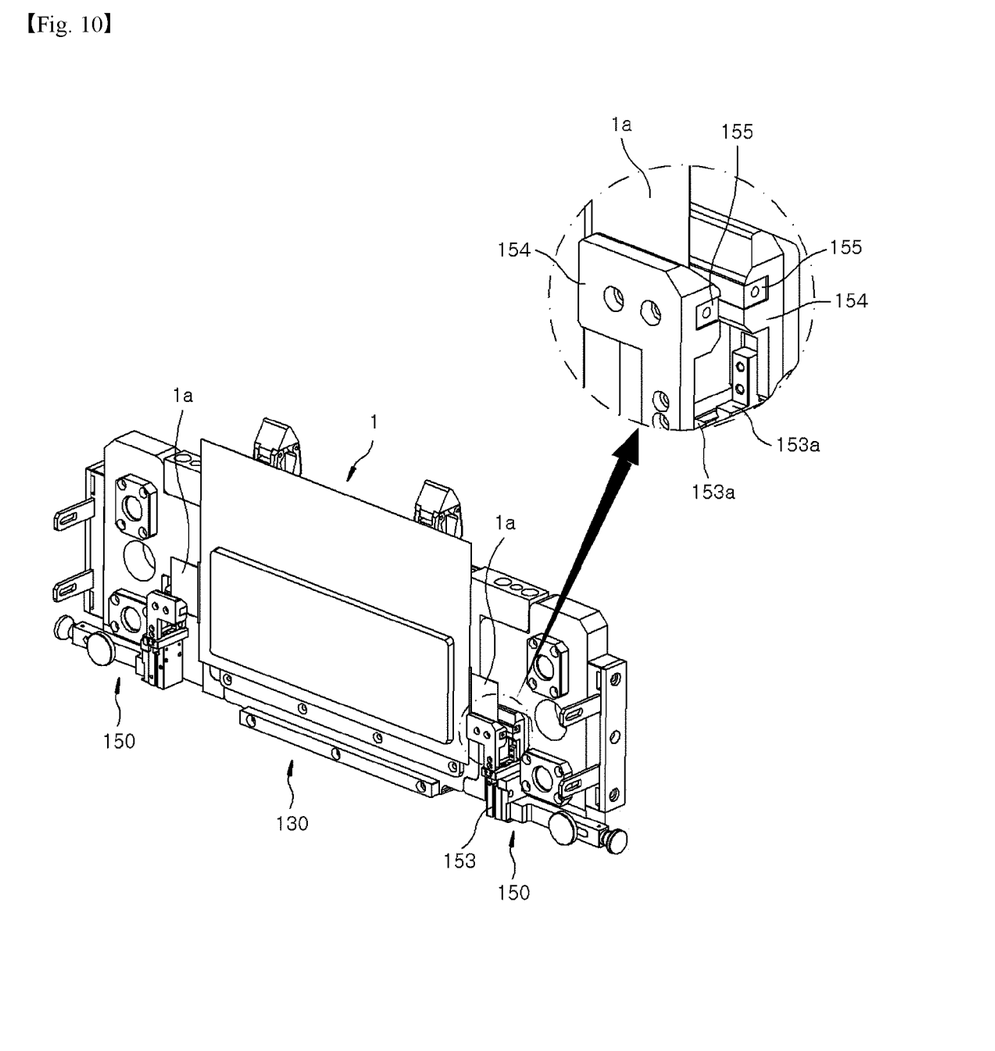
FIG. 10 is a perspective view illustrating an open state of an electrode module in a device for simultaneously inspecting a plurality of secondary battery cell pouches, from a different direction, according to an exemplary embodiment of the present invention.

As shown in FIG. 3, the movable member 120 is retracted by the operation of the pressing drive unit 160 so that the pressing panel 130 opens the gap between each other as much as possible by a connection link 131, and then as in FIGS. 9 and 10, a plurality of secondary battery cell pouches 1 are gripped by respective grippers (not shown) and mounted in respective gaps between the pressing panels 130. In this case, the electrode module 150 allows the gap between the electrode connection units 155 to be maintained as large as possible so that the electrode terminal 1a of the secondary battery cell pouch 1 is positioned between the electrode connection units 155.

Figure 11:
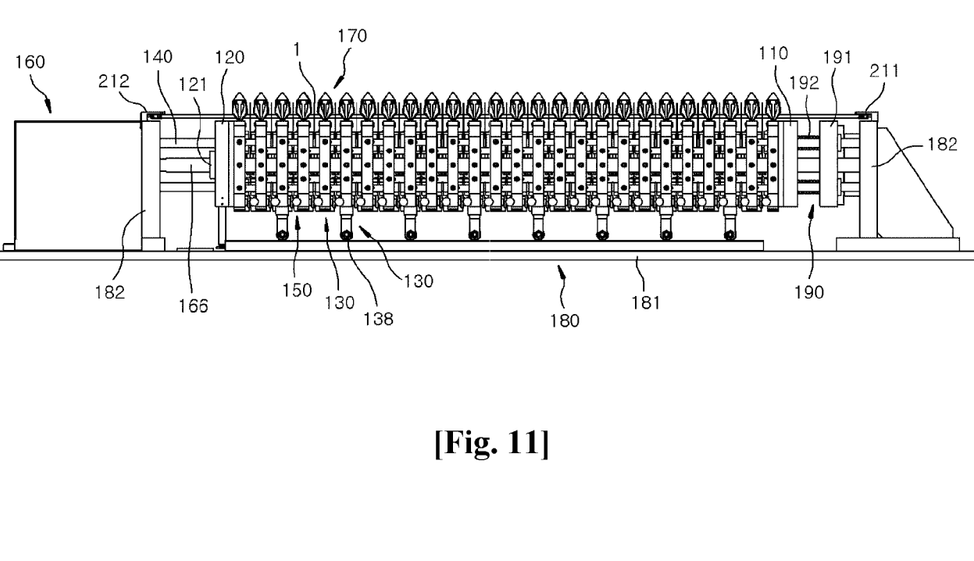
FIG. 11 is a side view illustrating a slot close state and an electrode close state of a device for simultaneously inspecting a plurality of secondary battery cell pouches according to an exemplary embodiment of the present invention.
Figure 12:
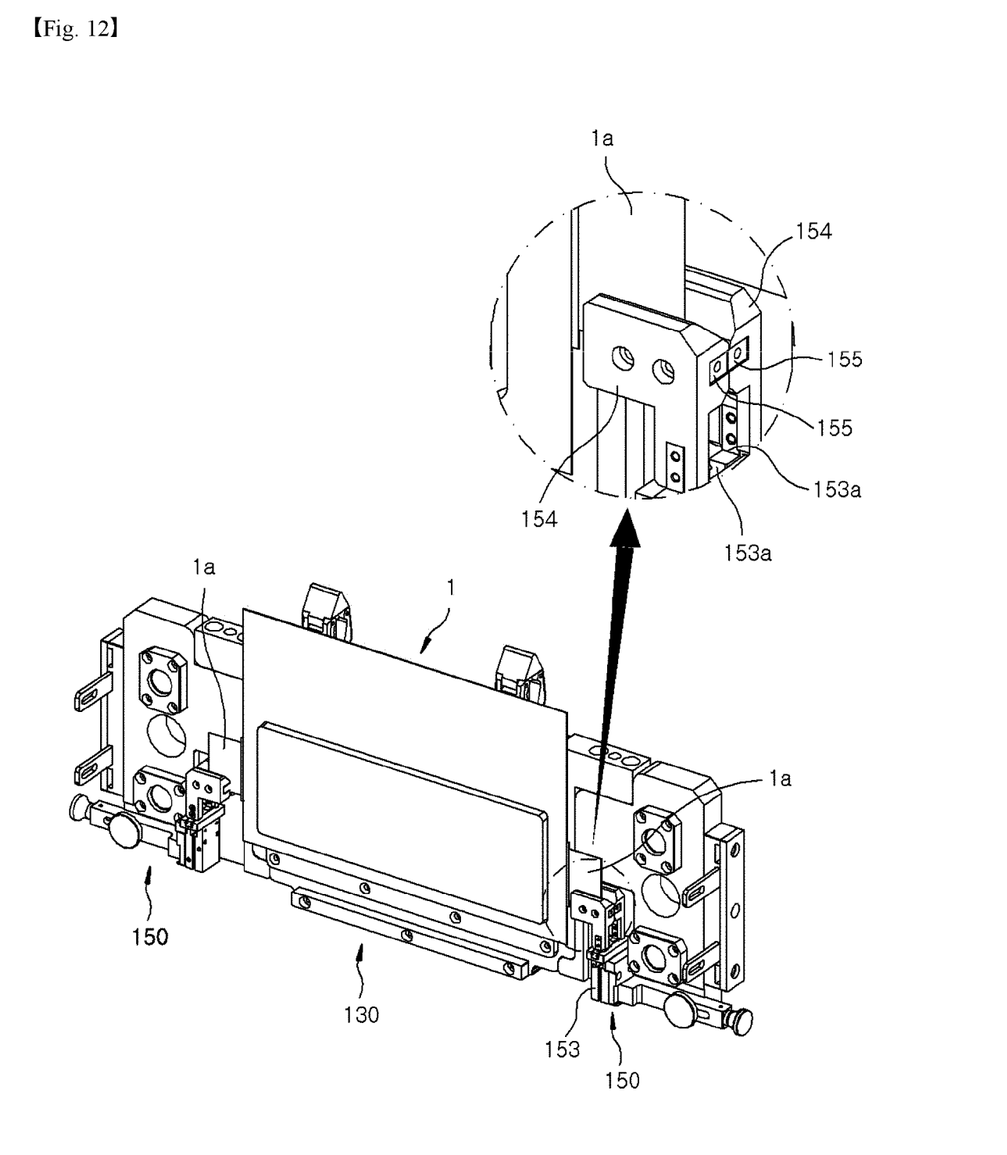
FIG. 12 is a perspective view illustrating a close state of an electrode module in a device for simultaneously inspecting a plurality of secondary battery cell pouches, from a different direction, according to an exemplary embodiment of the present invention.

As shown in FIGS. 11 and 12, when the secondary battery cell pouch 1 is installed between the pressing panels 130, the movable member 120 is advanced by the operation of the pressing drive unit 160, to thereby simultaneously pressurize the secondary battery cell pouch 1 as the interval between the pressing panels 130 are reduced. Due to such pressurization, the secondary battery cell pouch 1 does not properly insulate the positive electrode and the negative electrode due to contact between the positive electrode and the negative electrode when the internal membrane is damaged.

Further, the electrode module 150 allows the electrode connection unit 155 to be electrically connected to the electrode terminal 1a of the secondary battery cell pouch 1 by the operation of the electrode actuator 153, then current supplied from the current measuring unit using a cable, an FPCB, various conductors, or the like is provided to the electrode terminal 1a through the electrode connection unit 155, and the amount of current received from the secondary battery cell pouch 1 to the electrode connection unit 155 through the other electrode terminal 1a is transmitted to the current measuring unit. The controller determines whether the secondary battery cell pouch 1 is good or not according to whether the measured value according to the measured amount of electricity or the degree of insulation corresponds to a predetermined standard and may allow the display unit or a data output device to display the result of the determination for each of the secondary battery cell pouches 1.

The inspection device of the present invention pressurizes the cell pouch 1 to allow a physically contact between the positive electrode and the negative electrode of the damaged part of the separator to induce the electric current of the positive electrode and negative electrode. When a constant voltage of a predetermined range is applied to the cell pouch 1 through the electrode connection unit 155 of the electrode module 150, the cell pouch with the damaged separator is subject to leakage current due to a tendency to maintain applied voltage. Since the cell pouch damaged by the leakage current has a large measured current value compared to a normal cell pouch, the cell pouch whose measured current value exceeds a predetermined value can be detected as a defective cell due to a separator damage.

After the inspection of the secondary battery cell pouch 1 is completed, the electrode module 150 allows the electrode connection unit 155 to be separated from the electrode terminal 1a of the secondary battery cell pouch 1 by the operation of the electrode actuator 153, then allows the gap between the pressing panels 130 to be maximized by the operation of the pressing drive unit 160, to thereby release the pressure on the secondary battery cell pouch 1. As such, the secondary battery cell pouches may be unloaded by the respective grippers from the gaps between the pressing panels 130 for subsequent processing.

In the case of the inspection device of the present invention, it is desirable that the electrode and separator are sufficiently impregnated with electrolyte, and the secondary battery cell pouch in the uncharged state before the pre-charge or initial charge or primary charge is inspected or the secondary battery cell pouch near the discharge state of 5% or less of state of charge (SOC) is inspected.

When the secondary battery cell pouch is charged, a gas and an SEI film having electrically non-conductive properties are formed at the interface of the electrode, which causes an increase in contact resistance between the positive electrode and the negative electrode, making it difficult to detect minute separator defects. In addition, in general, the secondary battery has a large voltage change rate per capacity in the range of 5% or less of SOC. Therefore, when a constant voltage is applied to an uncharged secondary battery cell pouch or a secondary battery cell pouch of 5% or less of SOC level, it may reach the applied voltage within a few seconds to several tens of seconds, so that the time for detecting a defective battery can be significantly shortened.

As described above, the present invention has been described with reference to the accompanying drawings, but various modifications may be made without departing from the spirit of the present invention. Therefore, the scope of the present invention should not be limited to the above embodiments, but should be defined by the claims and their equivalents.

DESCRIPTION OF SYMBOLS

1: secondary battery cell pouch 1a: electrode terminal
110: support member 120: movable member
121: ball screw 130: pressing panel
131: connection link 131a: guide hole
132: connection pin 133: sliding coupling member
134: through hole 135: mounting groove
136: pressing pad 137: pressing piece
138a: support roller 138: roller coupling unit
140: guide member 150: electrode module
151: fixed member 151a: extension hole
151b: knob 152: fixing bolt
153: electrode actuator 153a: movable tip
154: fixed piece 154a: mounting groove
155: electrode connection unit 155a: contact unit
160: pressing drive unit 161: drive motor
162: drive timing pulley 163: guide pulley
164: driven timing pulley 165: timing belt
166: lead screw 167: casing
167a: bottom panel 170: guide unit
171: support shaft 172: guide tip
173: hinge guide 173a: hinge pin
180: frame 181: base frame
182: support frame 190: elastic support unit
191: fixed panel 192: compression spring
211, 212: sensing unit

The invention claimed is:

1. A device for simultaneously inspecting a plurality of secondary battery cell pouches, the device comprising:
   a support member;
   a movable member installed to face the support member;
   a plurality of pressing panels installed in parallel between the support member and the movable member, adjacent pressing panels being coupled to allow adjustment of a gap between the adjacent pressing panels by movements of the movable member towards and away from the support member;
   a guide member configured to guide each pressing panel to allow adjustment of the gap between the adjacent pressing panels; and
   a pressing driver configured to move the movable member towards and away from the support member so as to be capable of pressing and releasing a secondary battery cell pouch located between the adjacent pressing panels.

2. The device of claim 1, further comprising a current inspector configured to apply a voltage to the secondary battery cell pouch and measure its current.

3. The device of claim 2, wherein the current inspector comprises:
   a power supply configured to apply a voltage so that the cell pouch pressurized by the pressing panel reaches a voltage in a predetermined range; and
   a current measuring unit configured to measure a current value of the cell pouch.

4. The device of claim 2, further comprising a controller configured to be respectively connected to the pressing driver and the current inspector to thereby control each operation of the pressing driver and the current inspector, and compare a current value measured by the current inspector with a reference value to thereby determine whether there is a defect.

5. The device of claim 4, wherein the controller determines whether there is a defect by comparing an average value of current values measured by the current inspector for 2 to 10 seconds with the reference value.

6. The device of claim 1, further comprising an electrode module configured to be connectable to one electrode terminal of the secondary battery cell pouch disposed in the gap between the adjacent pressing panels to thereby apply or receive current.

7. The device of claim 6, wherein the electrode module is installed in plurality between the pressure panels, and are fixed to each pressing panel to thereby move together with the pressing panel.

8. The device of claim 7, wherein each electrode module comprises:
a fixed member fixed to one side of the pressing panel;
an electrode actuator fixed to the fixed member and having movable tips disposed to be moveable to allow a gap adjustment between the movable tips;
a fixed piece fixed to each of the movable tips; and
an electrode connection unit configured to be in surface contact with opposite side surfaces of the electrode terminal of the secondary battery cell when driven by the electrode actuator, the electrode connection unit being installed on each of the fixed pieces to face each other.

9. The device of claim 8, wherein each electrode module is configured to be installed in a mounting groove formed in the pressing panel, in which a guide hole extending in a width direction of the secondary battery cell pouch is formed in the fixed member, and the fixed position is varied in the width direction by a fixing bolt inserted into a desired position in the guide hole and screwed into the mounting groove.

10. The device of claim 1, wherein each pressing panel includes:
connection links extending across the gap at opposite sides of the pressing panel, each connection link having a guide hole; and
connection pins located at the opposite sides of the pressing panels, the connection pins being inserted into the guide holes formed in the connection links of the adjacent pressure panels to thereby be coupled to each other so that the gap is adjustable by the connection links and the connection pins which are arranged alternately up and down.

11. The device of claim 10, further comprising a support roller connected to each pressing panel by a roller coupler.

12. The device of claim 1, wherein the pressing driver comprises:
a drive motor configured to supply a driving force;
a drive timing pulley configured to be rotated by the drive motor;
guide pulleys configured to be respectively installed on opposite sides of the drive timing pulley;
driven timing pulleys configured to be respectively installed on opposite sides of the drive timing pulley;
a timing belt configured to be connected to the driven timing pulleys from the drive timing pulley so as to be guided to the guide pulleys and thereby transmit a rotational force; and
a lead screw configured to be fixed to each of the driven timing pulleys so as to be rotated together, screwed through opposite sides of the movable member, and inserted into a through hole of the pressing panel.

13. The device of claim 1, further comprising a guide installed on an upper part of each pressing panel to guide an entry and exit of the secondary battery cell pouch with respect to the gap.

14. The device of claim 13, wherein the guide comprises:
a support shaft extending vertically upward from an upper end of the pressing panel;
a guide tip; and
a hinge guide having an upper portion hinged to opposite sides of the guide tip, the hinge guide having a "◁" shape to be disposed toward a gap side so that a central portion protrudes toward the gap side.

15. The device of claim 1, further comprising an elastic supporter configured to elastically support the support member to be restored toward the pressing panels, the elastic supporter including:
a fixed panel fixed to face the support member; and
a compression spring inserted into the guide member so as to be positioned between the fixed panel and the support member.

16. The device of claim 1, further comprising a pressing pad or a pressing piece attached to one side or opposite sides of each pressing panel.

17. The device of claim 1, wherein each pressing panel has connection links having guide holes extending in the direction of gap adjustment are fixed to both sides, respectively, and connection pins inserted into the guide holes formed in the connection links of adjacent pressing panels facing each other with the gap are provided at both sides thereof.

* * * * *